(12) United States Patent
Michalicek

(10) Patent No.: US 6,218,205 B1
(45) Date of Patent: Apr. 17, 2001

(54) POST-PROCESS DEPOSITING SHIELDING FOR MICROELECTROMECHANICAL SYSTEMS

(75) Inventor: M. Adrian Michalicek, Broomfield, CO (US)

(73) Assignee: The United States of America as represented by the Secretary of the Air Force, Washington, DC (US)

(*) Notice: Subject to any disclaimer, the term of this patent is extended or adjusted under 35 U.S.C. 154(b) by 0 days.

(21) Appl. No.: 09/169,494

(22) Filed: Oct. 9, 1998

(51) Int. Cl.[7] .......................... H01L 21/00; H01L 23/552
(52) U.S. Cl. ................... 438/28; 438/26; 438/34; 257/659
(58) Field of Search .................. 438/26, 28, 34, 438/38; 257/659

(56) References Cited

U.S. PATENT DOCUMENTS 5,216,490 * 6/1993 Greiff ........................... 73/514.35

OTHER PUBLICATIONS

"Development of advanced second–generation micromirror devices fabricated in a four–level, planarized surface–micromachined polycrystalline silicon process," Michalicke et al., SPIE vol.3292 Jan. 28, 1998.*

"Design and characterization of next–generation micromirrors fabricated in a four–level, planarized surface–micromachined polycrystalline silicon process," Michalicek et al. IEEE Oct. 10, 1997.*

"Design and fabrication of optical MEMS using a four-–level, planarized, surface–micromachined polycrystalline silicon process," SPIE Jan. 26, 1998.*

M. A. Michalicek, J. H. Comtois, and H. K. Schriner, "Design and fabrication of optical MEMS using a four-–level, planarized, surface–micromachined polysilicon5 process," *Proc. SPIE*, vol. 3276, pp. 48–55, 1998.

M. A. Michalicek, J. H. Comtois, and H. K. Schriner, "Development of advanced second–generation micromirror devices fabricated in a four–level, planarized, surface–micromachined polysilicon process," *Proc. SPIE*, vol. 3292, pp. 71–80, 1998.

M. A. Michalicek, J. H. Comtois, and C. C. Barron, "Design and characterization of next–generation micromirrors fabricated in a four–level, planarized, surface–micromachined polysilicon process," *Proc. Innovative Systems In Silicon*, 2nd Ed., IEEE Press, pp. 144–154, 1997.

* cited by examiner

Primary Examiner—Charles Bowers
Assistant Examiner—Nema Berezny
(74) Attorney, Agent, or Firm—Kenneth E. Callahan

(57) ABSTRACT

Post-process deposition of selected material onto MEMS devices is facilitated by photolithographically incorporating deposition shields during the device fabrication process. Subsequently, simple sputtering or evaporating deposition machines can be used to selectively deposit desired materials onto the MEMS devices.

3 Claims, 3 Drawing Sheets

POST-PROCESS DEPOSITING SHIELDING FOR MICROELECTROMECHANICAL SYSTEMS

STATEMENT OF GOVERNMENT INTEREST

The conditions under which this invention was made are such as to entitle the Government of the United States under paragraph 1(a) of Executive Order 10096, as represented by the Secretary of the Air Force, to the entire right, title and interest therein, including foreign rights.

BACKGROUND OF THE INVENTION

1. Field of the Invention

The field of Microelectromechanical Systems (MEMS) uses a variety of fabrication technologies, such as surface micromachining developed for the integrated circuit industry, to create highly miniaturized mechanical devices (usually 1 $\mu$m to 1 mm in size) on a microelectronic chip. This invention is in the field of microelectromechanical systems (MEMS and in particular relates to the post-process deposition of some material onto MEMS devices.

2. Description of the Prior Art

The majority of microelectromechanical systems (MEMS) in use today are fabricated in a variety of surface micromachining processes. Surface micromachined devices are formed by the alternate deposition of structural layers to form the device and sacrificial spacer layers to provide mechanical and electrical isolation. Polycrystalline silicon (polysilicon) is the most commonly used structural material and silicon dioxide (oxide) glass is the most commonly used sacrificial material. These layers, formed above a silicon substrate isolated with a layer of silicon nitride, are patterned (using the same advanced photolithography technology employed by the microelectronics industry) to form intricate structures such as motors, gears, mirrors, and various sensors. Cuts made through the oxide layers are used to anchor the upper structural levels to the substrate or to the underlying mechanical structures. At the end of the process, the sacrificial layers are removed using various techniques, such as a hydrofluoric acid release etch, which frees the device to move relative to the substrate. (M. A. Michalicek, J. H. Comtois, and H. K. Schriner, "Design and fabrication of optical MEMS using a four-level, planarized, surface-micromachined polysilicon5 process," *Proc. SPIE*, Vol. 3276, pp. 48–55, 1998.)

The complexity of the micromachines that can be manufactured in a given process is a function of the number of independent layers of structural material the technology provides. A single independent level of structural material limits designers to simple sensors. Geared mechanisms require two releasable structural layers, a Poly-1 layer to form the gears and a Poly-2 layer to form the locking hub above the ground layer (Poly-0). Motorized geared mechanisms require a minimum of three independent levels. Far more complex mechanisms and systems require even more structural layers.

Surface micromachining fabrication of electronics and MEMS is well developed and widely used both privately and commercially. Countless companies, universities, and government agencies have fabricated micromechanical devices for the last 10 years or more. However, designers are limited to the layers that are offered by the foundry. For instance, the Multi-User MEMS Process (MUMPs) offered commercially by the Microelectronics Center of North Carolina (MCNC) has three layers of polysilicon and one layer of gold that the engineer can use to build his or her devices.

Deposition of materials onto parts of these micromechanical devices is frequently required. Currently, a designer is limited to the layer provided by the foundry or must spent considerable time and money duplicating the foundry process just to add another layer after the chip was fabricated. This process requires numerous photolithographic steps to accomplish the deposition of material in only the locations on the chip that the designer wished. The present invention simplifies this post-process deposition of materials onto MEMS devices.

Using the present invention, this can be done using a common sputtering or evaporating machine once the bond pads, wiring and other sensitive structures have been shielded by a masking surface that is built into the design and fabricated along with the devices on the chip. The shield is used to catch the excess material that would normally be deposited onto wiring or other features that the designer did not wish covered. The material is simply deposited onto the entire surface of the chip that has been designed with a deposition shield. All exposed surfaces, such as the shield and the structures requiring the deposition, are coated whereas all other structures beneath the shield, such as wiring and mechanical support assemblies, are not coated. Therefore, the designer no longer has to rely on the expensive and time-consuming approach of using standard lithography to deposit materials onto certain, but not all, features on the chip. The designer can now determine the devices he or she wants coated before the chip is fabricated and simply build the shield around those devices out of the same layers of material provided by the foundry.

SUMMARY OF THE INVENTION

Post-process deposition shields are built into the design layout of MEMS devices in the present invention. These shields isolate each bond pad and allow no address wiring or sensitive structures to be exposed anywhere on the chip. The support posts of these shields are recessed a certain distance to ensure that even a worst-case deposition of a conductive material will not short the bond pads or wiring to the shields. Additionally, since the material is deposited by simple sputtering or evaporating deposition machines, the designer can now choose any material to be deposited and not be limited by what the foundry has to offer. The designer can choose a material based on optimized material properties, thereby making it easier and more effective to fabricate any given device that requires a material coating.

DESCRIPTION OF THE PREFERRED EMBODIMENT

The post-process deposition technique of the present can be used to deposit a desired material, to a desired thickness, onto micromechanical components that are fabricated in a standard surface micromachining process. The choice of materials is virtually limitless since the material does not have to survive the harsh release etch that frees the mechanical devices and allows them to move. The method involves photolithographically incorporating shields in the design layout of the MEMS devices during their fabrication. Subsequent material deposition onto the MEMS device using simple sputtering or evaporating deposition machines can then be done since the shields permit coating of only the desired parts of the device.

This technique was initially developed to deposit a layer of gold onto micromirror devices, but is applicable to all types of MEMS devices. Several arrays of micromirror devices were initially fabricated as first-generation test devices. They were fabricated with deposition shields surrounding them with approximately 350 $\mu$m margins to allow for the manual placement of a masking material under a microscope. The oxide and array wiring under the deposition shield was trapped to increase the strength of the shield that would have to withstand significant abuse during placement of the masking material. This technique was successfully demonstrated using gold in a simple Ladd benchtop-sputtering machine.

Figure 1:
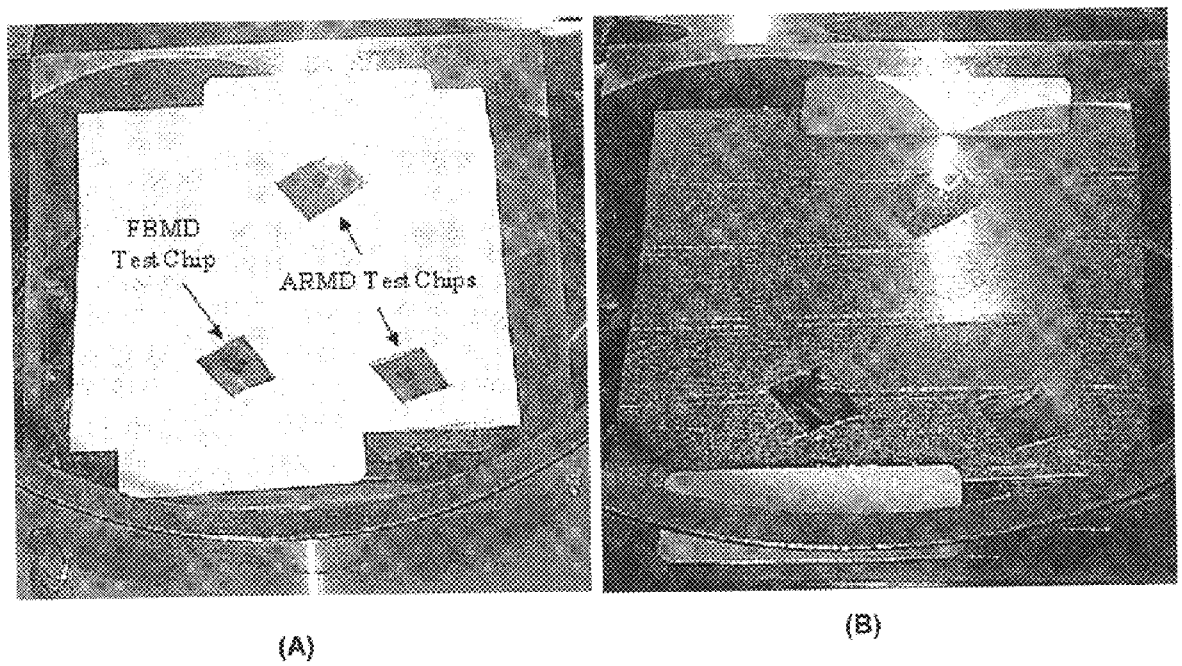
FIG. 1 illustrates the first design version of this deposition shield used by the inventor.

The address wiring of these first-generations test chips runs beneath the deposition shield which is secured with anchors and trapped oxide in order to provide more structural support when masking off the micromirror arrays. FIG. 1 illustrates the masking and gold metallization of one Flexure-Beam Micromirror Device (FBMD) test chip and two Axial-Rotation Micromirror Device (ARMD) test chips. Small strips cut from Electrostatic Discharge (ESD) protection pouches, used as the masking material, were placed around the edges of the arrays using double-sided tape affixed to a flat work surface. This task was easily completed by hand under a microscope. The larger white mask shown in FIG. 1(A) was used only to help identify the chips in the illustration. These test chips were metallized with 150 mn of gold as shown in FIG. 1(B). The edges of the ESD masking material were placed close enough to the array so that the deposited material that fell through the opening landed either on the micromirror devices or the deposition shield. In this way, the deposition shield, combined with the masking material, protected all features that the designer did not want metallized.

Figure 2:
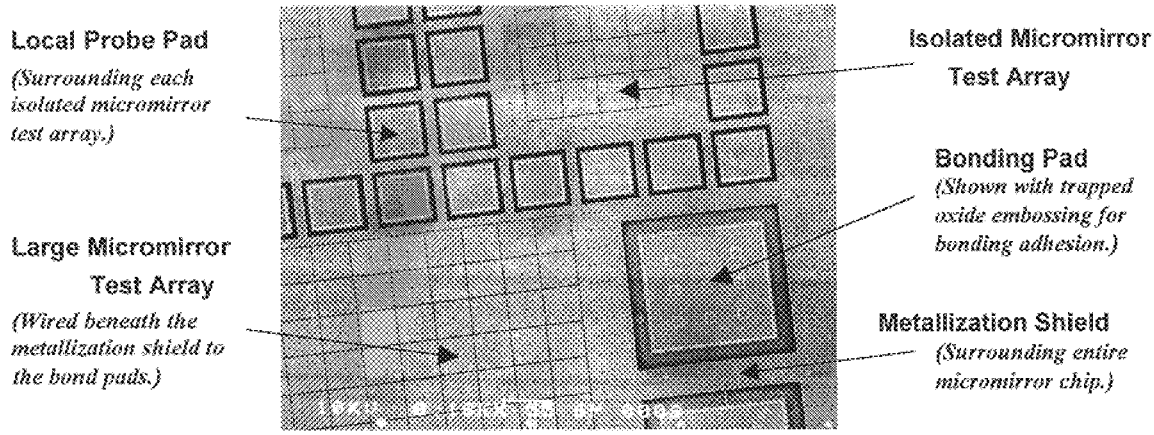
FIG. 2 shows an improved design version of this deposition shield in which all previously exposed wiring and underlying structure is hidden beneath a planarized upper layer of material.

An alternate approach was developed for second-generation test chips in which the deposition shield is built into the design layout so that no post-process masking is needed. FIG. 2 shows this shield surrounding several micromirror arrays and the probe and bond pads that are used to actuate them. This shield isolates each bond pad and allows no address wiring to be exposed anywhere on the chip. As a result, the entire chip appears as a single layer of planarized polysilicon in which portions are removed for probe and bond pads. It is beneficial to use this shield as the ground plane, so a significant margin around the bond pads must be maintained to prevent shorting during bonding and packaging of the chips.

Several micromirror arrays are visible in this FIG. 2 micrograph which demonstrates use of the deposition shield around the pads and the devices. The view of this figure is from above several arrays of micromirrors. Each device appears as a single square of planarized polysilicon with a surrounding shield made of the same layer. The micromirror devices are the target devices and the pads are also metallized for electrical contacts. This type of post-process deposition shield can be used in any surface micromachining process such that all address wiring runs beneath an upper layer of structural material that is used to shield the wiring or mechanical structures from the deposited material. When the chip is coated with the desired material, all exposed features and mirror surfaces are covered while wiring and hidden structural assemblies remain isolated. The improvement over the first-generation test design is that the shield was extended out to the edges of the entire chip, rather than just a margin around the arrays. Therefore, any material that is deposited on the chip will rest either on the target devices or the deposition shield and no masking materials need be placed by hand.

Figure 3:
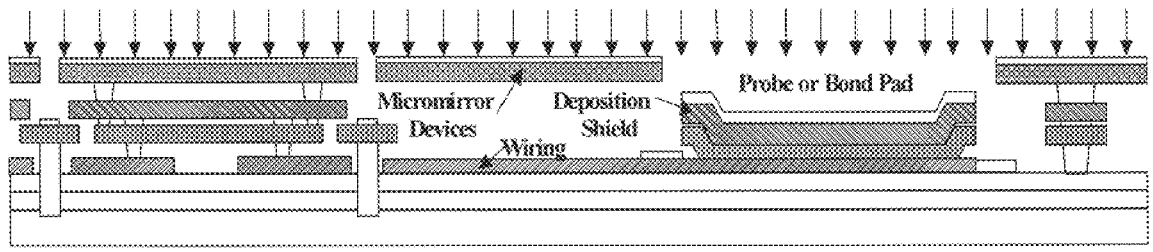
FIG. 3 shows a cross section of the chip shown in FIG. 2 and illustrates how the deposition shield stops the deposited material from shorting wires or electrically connecting other features.

FIG. 3 illustrates this use of this improved deposition shield and shows how the shield extends out around each bond pad. The shield covers everything on the chip except for the items the designer wants exposed, namely the micromirror surfaces and the probe and bond pads. All other features of this chip are hidden beneath the shield. Note that the deposited material does not extend underneath the shield nor does it make contact with the posts that support the shield. The wires that connect to each pad can be partially metallized because only one wire is exposed within each pad window, thereby maintaining electrical isolation. This deposition shield is also included within each micromechanical device that may have gaps or holes in the surface through which the deposited material may pass. In this case, the micromirrors on the chip are separated by 1-$\mu$m gaps between each device.

Figure 4:
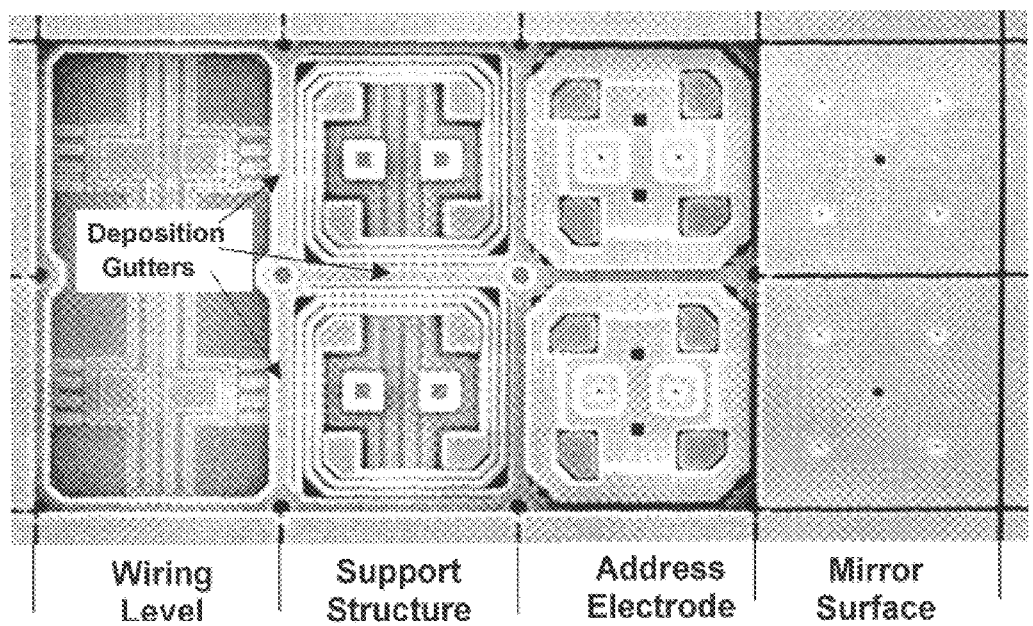
FIG. 4 is a micrograph of a micromirror device showing deposition gutters running beneath the edges of the mirror surface.
Figure 5:
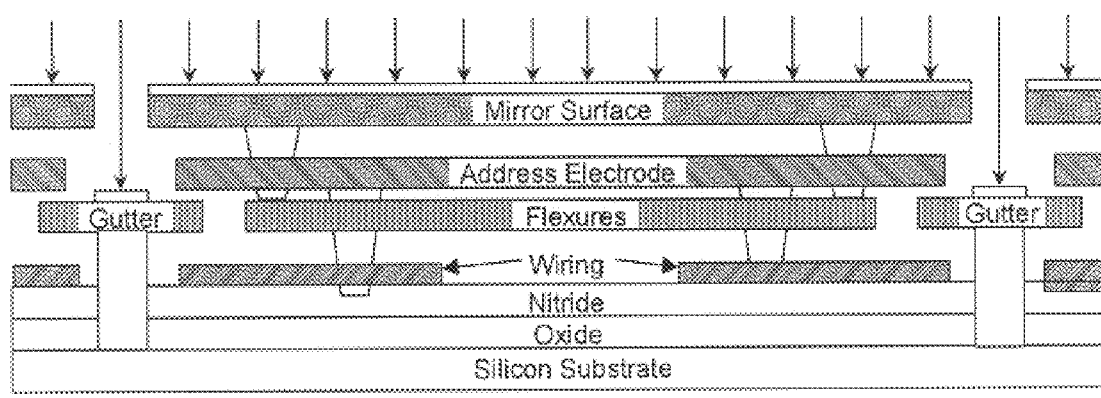
FIG. 5 demonstrates the use of deposition gutters within a micromirror device to protect address wiring during deposition of a layer of gold.

FIG. 4 shows one type of micromirror device in which a deposition gutter runs beneath any gaps in the mirror surface. The figure shows successive layers of the MEMS device. The gutter catches any material deposited by the post-process deposition so that the wiring is not shorted and the mechanical motion of the underlying structure of the device is not obstructed. FIG. 5 more closely illustrates the use of this deposition gutter by showing a cross section of the device in FIG. 4 during deposition.

Combined with the upper level shielding that surrounds each array, shown in FIGS. 2 and 3, this deposition gutter completes a total post-process deposition shielding technique that makes it possible to deposit any material onto micromechanical devices after the chip is commercially fabricated. Therefore, a designer can now make his or her devices using virtually any fabrication process available and then select a desired material after the chip is delivered and released. This process has proven highly effective for micromirror devices, but can work equally well for any type of sensor or actuator. As a result, such MEMS devices can be fully optimized to a given application such as optical, microwave, or RF systems where material properties of the structural elements are paramount to the successful operation of a device. Any type of micromechanical device can be coated or virtually encased in a post-process step that is directed and/or conducted by the engineer.

This invention can be used for any application where a certain material is desired on some MEMS devices, but would be harmful to the operation of another on the same chip. Conductive material such as gold or aluminum could be used for latching contacts or switching devices. Two plates that can move into contact with each other to form latches or switches will have much improved electrical properties if coated with metal.

Insulating material such as glass or plastics for electrical isolation or mechanical lubrication could be selectively deposited using this technique. Rotating mechanisms may require a bearing or other material to protect them from wear in the gear hub or may be used simply to reduce friction on the surface of moving objects. However, such a layer may also destroy other devices or prevent their motion if not selectively deposited.

Various materials are used as chemical sensors atop MEMS devices. A chemical that reacts with hydrogen, for instance, produces heat. When placed on the end of a certain type of cantilever beam, this heat creates motion that can easily be detected and quantified making such a structure a precise hydrogen sensor. However, it may be desirable to test for several chemicals on the same chip or to leave some cantilevers without this chemical for use as a normalizing control measurement. The selective deposition required could be accomplished using the present invention.

The shield material is whatever structural material the foundry offers. Typically, this is polysilicon, by far the most common material in surface micromachining. However, the shield can be made of any available layer of the foundry process, such as aluminum in a standard CMOS process, such that it covers sensitive structures patterned in the layers beneath it. That is the only requirement. The material that is deposited onto the shield is up to the designer and the requirements of the application. It does not have to be metal. The above examples illustrate this.

I claim:

1. A method of post-process deposition of a desired material onto microelectromechanical systems, comprising
   a. photolithographically incorporating one or more nonconductive shield layers into said microelectromechanical system during its fabrication such that said shield layer is positioned above and protects any wiring or other structures not intended for subsequent deposition;
   b. overlapping said wiring or other structures sufficiently to prevent a desired deposition material from being deposited on said wiring or other structures; and
   c. depositing a desired material onto said microelectromechanical system after the fabrication of said microelectromechanical system is complete.

2. The method as set forth in claim 1 wherein the depositing process is by simple sputtering or by evaporative deposition.

3. The method as set forth in claim 1, wherein the deposition material is any material that can be deposited by standard methods, such as sputtering or evaporative deposition.

* * * * *